United States Patent [19]

Koide

[11] Patent Number: 5,437,761
[45] Date of Patent: Aug. 1, 1995

[54] LITHIUM NIOBATE CRYSTAL WAFER, PROCESS FOR THE PREPARATION OF THE SAME, AND METHOD FOR THE EVALUATION THEREOF

[75] Inventor: Akira Koide, Tatebayashi, Japan

[73] Assignee: Nihon Kessho Kogaku Co., Ltd., Tatebayashi, Japan

[21] Appl. No.: 206,097

[22] Filed: Mar. 4, 1994

[30] Foreign Application Priority Data

Mar. 9, 1993 [JP] Japan .................................. 5-072754

[51] Int. Cl.$^6$ ............................................... B44C 1/22
[52] U.S. Cl. ...................... 216/85; 385/141; 216/85; 216/101
[58] Field of Search ............. 156/626, 636, 654, 645, 156/667, 662; 117/13, 14; 385/141, 147

[56] References Cited

U.S. PATENT DOCUMENTS

| | | | |
|---|---|---|---|
| 3,860,467 | 1/1975 | Lim | 156/626 |
| 3,954,940 | 5/1976 | Rice et al. | 156/645 X |
| 4,390,392 | 6/1983 | Robinson et al. | 156/645 X |
| 4,412,886 | 11/1983 | Sakaguchi et al. | 156/636 X |

FOREIGN PATENT DOCUMENTS 2119673 11/1983 United Kingdom .

OTHER PUBLICATIONS

Journal of Applied Physics, vol. 68, No. 11, Dec. 1, 1990 New York pp. 5804–5809 Dhar et al "Optical Properties of . . . " p. 5404 US.
Patent Abstracts of Japan, vol. 15, No. 500 (C-895) Dec. 18, 1991 & JP-A-03 218 996 (Sumitomo Metal Mining Co., Ltd.) Sep. 26, 1991.

*Primary Examiner*—William Powell
*Attorney, Agent, or Firm*—Bucknam and Archer

[57] ABSTRACT

A lithium niobate crystal wafer wherein the deviations of the maximum and minimum absorption coefficients of the wafer at a wavelength of 2.87 μm from the average absorption coefficient thereof at that wavelength fall within the range of ±0.1 cm$^{-1}$ exclusive of both borders; a process for the preparation of the same; and a method for the evaluation thereof.

3 Claims, 3 Drawing Sheets

LITHIUM NIOBATE CRYSTAL WAFER, PROCESS FOR THE PREPARATION OF THE SAME, AND METHOD FOR THE EVALUATION THEREOF

BACKGROUND OF THE INVENTION

1. Field of the Invention

The present invention relates to a lithium niobate crystal wafer which can be utilized as a substrate of an optical waveguide or elastic surface wave device, a process for the preparation of the same, and a method for the evaluation thereof. Particularly, it relates to a lithium niobate crystal wafer exhibiting remarkably reduced residual strain, a process for preparing the wafer at high productivity, and a method for evaluating the same.

2. Description of the Prior Art

Up to this time, ferroelectric crystals such as lithium niobate and lithium tantalate crystals have been used for the production of elastic surface wave, Pockels, non-linear and pyroelectric elements and so on, by virtue of their excellent acoustic, electro-optical and pyroelectric effects. Generally, these crystals are grown by the Czocharalski method, annealed for the prevention of cracking in processing, poled for single polarization, and thereafter processed into a cylinder. This cylinder generally has a diameter of 50 to 130 mm and a length of 30 to 100 mm. The cylindrical crystal boule thus prepared is cut into blocks having a specific crystal orientation, or sliced into wafers, followed by lapping and polishing. Then, the resulting products are provided as crystals for various devices.

When lithium niobate crystal is used in the form of a wafer, the wafer generally has a diameter of 50 to 125 mm and a thickness of 0.3 to 5 mm and is used in the production of optical waveguide, surface acoustic wave and pyroelectric elements and so on.

However, residual strain is observed in some of the conventional ferroelectric crystal wafers and the residual strain in such wafers causes unevenness of characteristics of optical devices due to uncontrol of the release of the residual strain in the manufacturing process of the optical devices. In addition, the strain present in an elastic surface wave device brings interference against elastic surface waves and results in unstable temperature dependency. Consequently, the residual strain impedes providing a more stable device for practical use.

In order to overcome these disadvantages, a lithium tantalate crystal wafer for an elastic surface wave device has been reported in Japanese Patent Publication No. 25420/1992, which is reduced in the variation in index of double refraction in the wafer. However, this patent document does not disclose any clear description of the preparation of such a crystal wafer and the object providing the crystal wafer free from the above disadvantages at high productivity has not been accomplished at all.

Further, it has been a common practice to reduce the residual strain of a crystal wafer by annealing a crystal boule just after the crystal growth, but this method cannot serve as a means for reducing the residual strain without fall.

As described above, there has not been found any effective means for reducing the residual strain which brings about unexpected lowering in the quality.

SUMMARY OF THE INVENTION

The present invention has been made to solve these problems of the prior art and aims at providing a lithium niobate crystal wafer exhibiting reduced residual strain, a process for the preparation of the same, and a method for the evaluation thereof.

The inventors of the present invention have made intensive studies for the above purpose with their attention directed to the absorption coefficient at a wavelength of 2.87 μm and, as the result of their studies, have found that when the absorption coefficients of a lithium niobate crystal wafer determined at that wavelength are uniform, the crystal wafer exhibits no or reduced residual strain and that the annealing of lithium niobate crystal in the form of a wafer is effective in uniforming the absorption coefficients to thereby reduce the residual strain, though the annealing a crystal in the form of a boule is ineffective in this respect. No study has been made on the relationship between the absorption coefficient and the residual strain.

Thus, the lithium niobate crystal wafer of the present invention is characterized in that the deviations of the maximum and minimum absorption coefficients of the wafer at a wavelength of 2.87 μm from the average absorption coefficient thereof at that wavelength fall within the range of ±0.1 cm$^{-1}$ exclusive of both borders. That is, the deviations thereof is necessary to fall within the range of from more than −0.1 cm$^{-1}$ to less than +0.1 cm$^{-1}$.

It is well known that the absorption coefficient of lithium niobate crystal at a wavelength of 2.87 μm can be determined by measuring the spectral transmittance of the crystal and represents the concentration of hydride ions or protons contained in the crystal. Accordingly, the fact that non-uniform absorption coefficients at a wavelength of 2.87 μm are observed in a lithium niobate crystal wafer means that the proton concentration of the wafer is not homogeneous.

Each absorption coefficient value was determined by the calculation according to the following formula based on the transmittances measured with a polarized light perpendicular to the z axis of the crystal: absorption coefficient ($\alpha$, cm$^{-1}$)

$$= -\ln (T/To)/t \qquad (1)$$

wherein T is the transmittance of absorption peak at a wavelength of 2.87 μm; To is the transmittance determined on the assumption that no absorption occurs; and t is the thickness (cm) of a sample crystal.

It is believed that when a lithium niobate crystal wafer is not homogeneous in proton concentration, the difference in electrostatic force occurring amount protons between the high-proton-concentration area and the low-proton-concentration area may act as a stress to cause strain.

As described above, it is necessary that the variation in the absorption coefficient at a wavelength of 2.87 μm in the wafer, i.e., the deviations of the maximum and minimum absorption coefficients of the wafer surface from the average one thereof fall within the range of ±0.1 cm$^{-1}$ exclusive of both borders, in order that the residual strains in a lithium niobate crystal wafer cannot be observed at all.

The process for the preparation of a lithium niobate crystal wafer according to the present invention will now be described.

The process for the preparation of a lithium niobate crystal wafer according to the present invention is characterized in that lithium niobate crystal is annealed in the form of a wafer, and thereafter the resulting wafer is lapped and polished.

More precisely, the lithium niobate crystal wafer of the present invention is prepared by growing lithium niobate crystal generally by the Czochralski method, subjecting the obtained crystal to annealing and poling, processing the crystal into a cylinder, slicing the cylindrical crystal boule into a wafer having a specific crystal orientation, annealing the wafer again, and subjecting the resulting wafer to lapping and polishing, and is used as a substrate of an optical waveguide or elastic surface wave device. Ordinary annealing conditions (including temperature, time and atmosphere) may be employed in the above annealing step. For example, the annealing may be conducted at 1000° C. in an atmosphere of oxygen, nitrogen, argon, water vapor or a mixture of them under a reduced pressure for 10 hours.

Mere annealing of the crystal boule will fail in reducing the residual strain, presumably because the uniforming of the proton concentration by this means depends solely on thermal diffusion in this case, so that it takes a long time to accomplish the uniforming.

On the other hand, the annealing of lithium niobate crystal in the form of a wafer according to the present invention can afford a uniform proton concentration in the crystal in a short time in only one annealing run. This is conceivably because not only thermal diffusion of the protons in the crystal but also the migration thereof through the wafer surface contribute to the uniforming proton concentration owing to the thinness of the wafer.

Accordingly, the proton concentration in lithium niobate crystal can be uniformed in a short time by annealing the crystal in the form of a wafer, which enables the preparation of a lithium niobate crystal wafer exhibiting reduced residual strain without fail at high productivity.

According to the present invention, it is essential for reduction in the residual strain of a lithium niobate crystal wafer that the variation in the absorption coefficient within the wafer fall within the range of $\pm 0.1$ cm$^{-1}$ exclusive of both borders. Further, it is more effective in reducing the residual strain to further reduce the variation.

It is to be noted in this respect that a lowered proton concentration of the crystal wafer necessarily gives a lowered variation in the absorption coefficient in the wafer.

As described above, a lithium niobate crystal wafer exhibiting reduced residual strain can be prepared at high productivity by annealing lithium niobate crystal in the form of a wafer and subjecting the resulting wafer to lapping and polishing.

Further, the method for the evaluation of a lithium niobate crystal wafer according to the present invention comprises determining the maximum and minimum absorption coefficients of the wafer at a wavelength of 2.87 μm.

As described above, there is a correlation between the difference between the maximum and minimum absorption coefficients of a lithium niobate crystal wafer at a wavelength of 2.87 μm and the residual strain of the wafer, so that the crystal wafer can be evaluated by, e.g., judging one wherein the difference between the maximum and minimum absorption coefficients at a wavelength of 2.87 μm is 0.2 cm$^{-1}$ or below as acceptable, while rejecting one wherein the difference exceeds 0.2 cm$^{-1}$.

As described above, the lithium niobate crystal wafer of the present invention exhibits reduced residual strain, so that it is extremely suitable for use in optical waveguide and elastic surface wave devices as a substrate. Particularly, when the crystal wafer exhibits both reduced residual strain and lowered proton concentration, the wafer is expected to solve the current DC drift problem of a light modulator or a photoswitch by virtue of its very low electric conductivity.

According to the present invention, a lithium niobate crystal wafer exhibiting sufficiently reduced residual strain can be prepared without fail at high productivity in a short time by annealing lithium niobate crystal in the form of a wafer. Further, the process of the present invention can be applied to any of the X to Z faces of a lithium niobate crystal wafer.

Further, the present invention remarkably facilitates the evaluation of a lithium niobate crystal wafer.

DESCRIPTION OF PREFERRED EMBODIMENTS

The present invention will now be described specifically by referring to the following Examples.

Example 1

[Relationship between the variation in absorption coefficient and the residual strain]

Various lithium niobate crystal wafers (z cut, φ76.2 mm, thickness: 1 mm) were selected, each of which had the absorption coefficient distribution given in Table 1. The wafers of Experimental Nos. 1 and 2 are ones which have undergone the annealing in the form of a wafer, while the other wafers are ones which have not undergone it. In the Table 1, each average absorption coefficient is the arithmetic mean of the absorption coefficients determined at twenty points selected in each wafer at uniform intervals, while each variation is the deviations of the maximum and minimum absorption coefficients among those determined at the twenty points from the average one.

Figure 3:
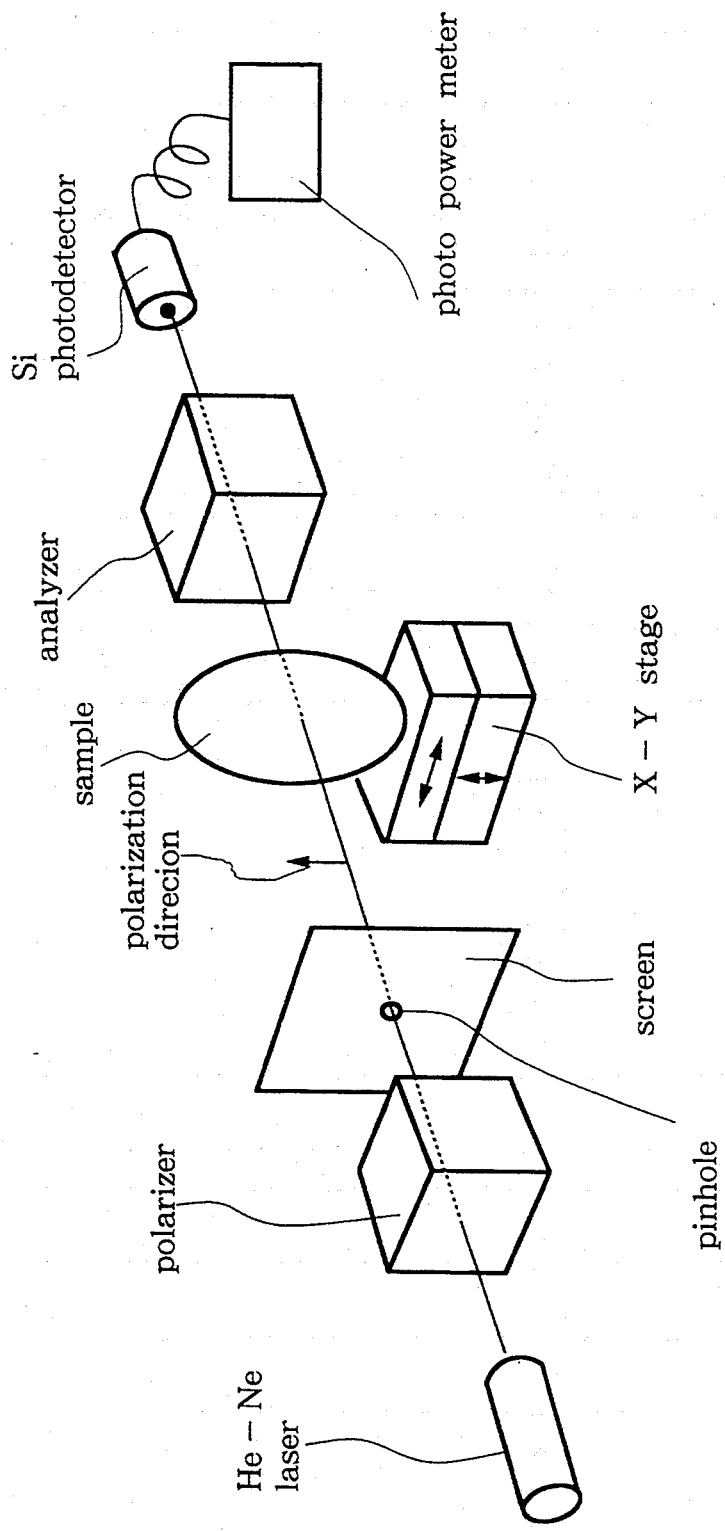
FIG. 3 is a schematic view of an optical system for measuring the extinction ratio distribution.

Whether there is any residual strain in each wafer was determined with an optical system shown in FIG. 3, i.e., by the extinction ratio method.

More precisely, each wafer was examined for extinction ratio distribution on an X-Y table with a He-Ne laser (power output: 0.5 mW, beam diameter: 1 mm) as a light source and a Glan-Thompson polarizer.

When residual strain is present in a lithium niobate crystal wafer, the linear polarized light incident on the crystal wafer is converted by a photoelastic effect into an elliptical one, the output of which is recorded with an optical power meter set behind the analyzer.

The extinction ratio was calculated by the following formula:

$$\text{extinction ratio } (dB) = -10 \times \log(P/Po) \quad (2)$$

wherein Po is the optical power recorded when no sample is set; and P is that recorded when a sample is set.

The strain of a lithium niobate crystal wafer has a directional property, because it is caused by the stress present in the crystal. In this Example, a polarized light having a certain direction of polarization is made to strike on the wafer surface, so that the extinction ratio is high on the minus side in a case where the direction of the stress is parallel or perpendicular to the direction of polarization, while it approaches 0 in other cases.

Figure 1:
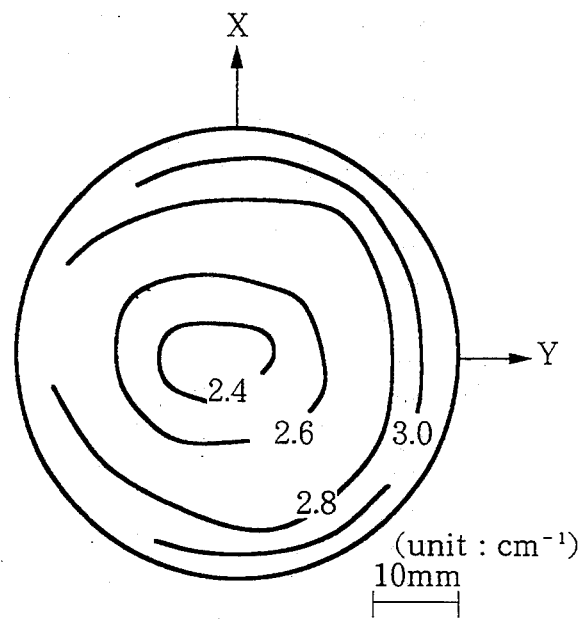
FIGS. 1(a) and (b) show, respectively, the pattern of light absorption coefficient distribution and that of extinction ratio distribution on a crystal wafer (Z face) according to the prior art.
Figure 1:
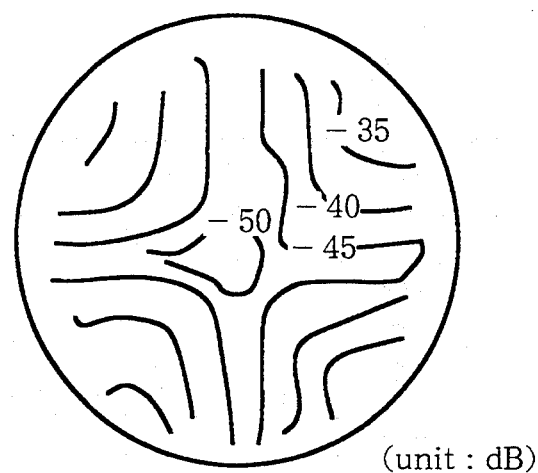
Figure 2:
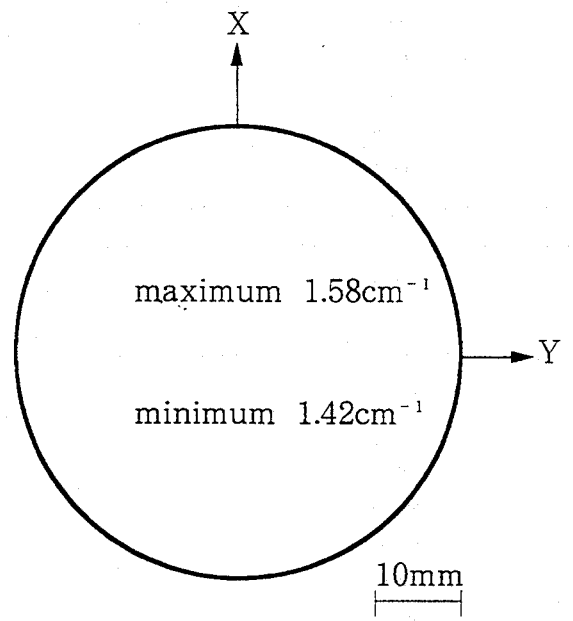
FIGS. 2(a) and (b) show, respectively, the pattern of light absorption coefficient distribution and that of extinction ratio distribution on a crystal wafer (z face) according to the present invention.
Figure 2:
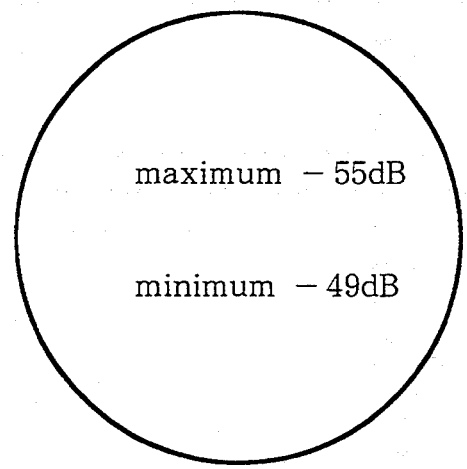

Specifically, when residual strain is present in the wafer, the extinction ratio distribution as shown in FIG. 1(b) is observed, while when no residual strain is present therein, the observed extinction ratios are high on the minus side and uniform as shown in FIG. 2(b).

The results are given in Table 1, in which cases where clear distribution was observed as shown in FIG. 1(b) are represented by "X"; those wherein no distribution was observed as shown in FIG. 2(b) are represented by "⊚"; and those intermediate between both wherein slight distribution was observed are represented by "O".

TABLE 1

| Expt. No. | Av. absorption coef. in wafer ($cm^{-1}$) | Var. in absorption coef. in wafer ($cm^{-1}$) | Evaluation on residual strain |
| --- | --- | --- | --- |
| 1* | 0.1 | ±0.05 | ⊚ |
| 2* | 0.4 | ±0.08 | ⊚ |
| 3 | 1.7 | ±0.1 | O |
| 4 | 4.5 | ±0.2 | O |
| 5 | 1.0 | ±0.3 | X |
| 6 | 1.7 | ±0.5 | X |
| 7 | 4.5 | ±0.8 | X |

* : crystal wafer prepared by annealing the crystal in the form of a wafer.

As shown in Table 1, the residual strain of a lithium niobate crystal wafer is slight when the variation in the absorption coefficient in the wafer falls within the range of ±0.2 $cm^{-1}$. Particularly, scarcely any contour pattern of the extinction ratio is observed when the variation falls within the range of ±0.08 $cm^{-1}$.

Example 2

[Effect achieved by annealing the crystal in the form of wafer: z face]

A lithium niobate crystal boule (Z-axis pulling, diameter: 80 mm, length: 50 mm) prepared by the Czochralski method was annealed, poled and sliced, followed by the lapping and polishing of both surfaces, giving thirty crystal wafers each having a thickness of 1.2 mm.

The X-ray topographic analysis of these wafers revealed that the crystal of each wafer was a good one free from subgrain.

The wafers were examined for absorption coefficient and residual strain in a similar manner to that of the Example 1. The average absorption coefficients of the wafers were different from each other and ranged from 2.5 to 3.0 $cm^{-1}$, and the variation in absorption coefficient in each wafer fell within the range of ±0.2 $cm^{-1}$ or above. Further, each wafer was examined for extinction ratio distribution to give the residual strain distribution pattern as shown in FIG. 1(b).

Then, the above wafers were annealed at 1000° C. in the air for 2 hours and subjected again to lapping and polishing to give wafers each having a thickness of 1.0 mm. These wafers were examined for absorption coefficient and residual strain. The average absorption coefficient of each wafer was 1.5 $cm^{-1}$ and the variation within each wafer fell within the range of ±0.08 $cm^{-1}$. Further, the wafers were each examined also for extinction ratio distribution to give uniform extinction ratios as shown in FIG. 2(b), which means that no residual strain is present in each wafer.

Example 3

[Annealing in dry oxygen: Z face]

A lithium niobate crystal boule (Z-axis pulling, diameter: 80 mm, length: 50 mm) prepared by the Czochralski method was annealed, poled and sliced, followed by the lapping and polishing of both surfaces, giving thirty crystal wafers each having a thickness of 1.2 mm.

The X-ray topographic analysis of these wafers revealed that the crystal of each wafer was a good one free from subgrain.

The wafers were examined for absorption coefficient and residual strain in a similar manner to that of the Example 1. The average absorption coefficients of the wafers were different from each other and ranged from 2.3 to 2.6 $cm^{-1}$ and the variation in absorption coefficient in each wafer fell within the range of ±0.2 $cm^{-1}$ or above. Further, each wafer was examined for extinction ratio distribution to give a residual strain distribution pattern as shown in FIG. 1(b).

Then, the above wafers were annealed at 1000° C. for 10 hours in dry (the dew point was under −70° C.) oxygen, followed by the lapping and polishing of both surfaces. Thus, wafers each having a thickness of 1 mm were obtained.

These wafers were examined for absorption coefficient. The average absorption coefficient of each wafer was 0.1 $cm^{-1}$ and the variation in each wafer fell within the range of ±0.05 $cm^{-1}$. Further, each wafer did not give any residual strain pattern.

What is claimed is:

1. A lithium niobate crystal wafer wherein the deviations of the maximum and minimum absorption coefficients of the wafer at a wavelength of 2.87 μm from the average absorption coefficient thereof at that wavelength fall within the range of ±0.1 $cm^{-1}$ exclusive of both borders.

2. A process for the preparation of a lithium niobate crystal wafer, which comprises annealing lithium niobate crystal in the form of a wafer and subjecting the resulting wafer to lapping and polishing.

3. A method for the evaluation of a lithium niobate crystal wafer, which comprises determining the difference between the maximum and minimum absorption coefficients of the wafer at a wavelength of 2.87 μm.

* * * * *